US012567278B2

(12) United States Patent
Ramirez Vicente et al.

(10) Patent No.: US 12,567,278 B2
(45) Date of Patent: Mar. 3, 2026

(54) COMPUTER PROJECT IMPLEMENTATION BASED ON A DESIGN OUTLINE

(71) Applicant: TELEFONICA INNOVACION DIGITAL, S.L.U., Madrid (ES)

(72) Inventors: Jose Francisco Ramirez Vicente, Madrid (ES); Pablo Gonzalez Perez, Madrid (ES); Eduardo Luis Alvarez Martinez, Madrid (ES); Pablo Saucedo De Miguel, Madrid (ES); Marcos Rivera Martinez, Madrid (ES)

(73) Assignee: TELEFONICA INNOVACION DIGITAL, S.L.U., Madrid (ES)

( * ) Notice: Subject to any disclaimer, the term of this patent is extended or adjusted under 35 U.S.C. 154(b) by 314 days.

(21) Appl. No.: 18/264,201

(22) PCT Filed: Feb. 4, 2021

(86) PCT No.: PCT/ES2021/070083
§ 371 (c)(1),
(2) Date: Aug. 3, 2023

(87) PCT Pub. No.: WO2022/167704
PCT Pub. Date: Aug. 11, 2022

(65) Prior Publication Data
US 2024/0087351 A1     Mar. 14, 2024

(51) Int. Cl.
*G06V 30/422* (2022.01)
*G06F 30/20* (2020.01)
*G06V 10/82* (2022.01)
*G06V 30/413* (2022.01)

(52) U.S. Cl.
CPC ............ *G06V 30/422* (2022.01); *G06F 30/20* (2020.01); *G06V 10/82* (2022.01); *G06V 30/413* (2022.01)

(58) Field of Classification Search
CPC .... G06V 30/422; G06V 10/82; G06V 30/413; G06V 10/774; G06V 30/10; G06F 30/20; G06F 8/20; G06F 8/34; G06N 3/0464; G06N 3/096
USPC ......................................................... 382/113
See application file for complete search history.

(56) References Cited

U.S. PATENT DOCUMENTS

| | | | |
|---|---|---|---|
| 2012/0213429 A1 | 8/2012 | Vasudevan et al. | |
| 2013/0159948 A1* | 6/2013 | Agarwal | G06F 30/398 |
| | | | 716/112 |
| 2017/0277518 A1 | 9/2017 | Krishnan et al. | |
| 2019/0250891 A1* | 8/2019 | Kumar | G06T 7/70 |
| 2020/0097263 A1* | 3/2020 | Lodhia | G06V 30/422 |

(Continued)

FOREIGN PATENT DOCUMENTS

| | | |
|---|---|---|
| CN | 112114803 A | 12/2020 |
| KR | 20190122107 A | 10/2019 |

OTHER PUBLICATIONS

International Search Report and Written Opinion issued in PCT Application No. PCT/ES2021/070083, Mailed Date: Sep. 14, 2021, 18 pages.

*Primary Examiner* — Jacky X Zheng
(74) *Attorney, Agent, or Firm* — Holzer Patel Drennan

(57) ABSTRACT

It is provided a method, device and system to facilitate the design or and architecture of a computer project and its subsequent automatic implementation, based on a hand-written/drawn draft (e.g. on paper). This draft directly becomes the tool that will be used, automatically, as the basis for the final computer project implementation.

13 Claims, 5 Drawing Sheets

(56) References Cited

U.S. PATENT DOCUMENTS

2021/0011693 A1    1/2021  Williamson et al.
2022/0092407 A1*   3/2022  Chen ........................ G06N 3/08

* cited by examiner

COMPUTER PROJECT IMPLEMENTATION BASED ON A DESIGN OUTLINE

OBJECT OF THE INVENTION

This invention is applied in the implementation and design of computer projects. More specifically, this invention refers to a method, device and system that allows for the implementation of computer projects, quickly, efficiently and saving resources, from a simple design draft which can be hand-written/drawn.

BACKGROUND OF THE INVENTION

During the first stages of a project of any kind, one of the first steps is to visualize in the best possible way, all its components, relationships and even an operating or execution flow. A technique of these early design phases could be, for instance, to make a simple draft by hand using different objects to represent each component of the idea. This draft will be an important starting point that will serve as a foundation when carrying out the deployment of the original idea. But what if you could directly use that original draft as input to automatically build a deployment of the intended project? That is, starting from a simple drawing on paper and following a few simple rules to draw the different components (depending on the type of project), that draft/sketch could be directly the input of an application that finally, will offer as output, all the necessary components for its implementation (source code, databases, etc.).

This text offers a solution which aims at facilitating the implementation of different computer projects (computer programs, software) starting from a draft written on paper, using Artificial Intelligence techniques. Such computer project can be of very different types (as detailed below) for example, from the complete creation of a frontend/backend solution, including its operation flow (for example, a web application with its database), implementation of architectures/platforms in the cloud, implementation of databases and even implementation of Machine Learning architectures for the deployment of neural networks.

Currently, there are some simple solutions that allow the design of a computer program from a draft but none of them allows the implementation of such a wide variety of types of projects, nor does it present the technical advantages of ease, efficiency, precision, agility and saving resources offered by this solution.

The objective technical problem can be, for example, to provide a method, device and system for the implementation of computer projects from hand-made drafts in a simple, transversal, fast, accurate and that allows saving both time resources and computer tools.

DESCRIPTION OF THE INVENTION

This invention provides a method, device and system to facilitate the architecture design of a computer project and its subsequent automatic implementation, based on a hand written and/or drawn draft (e.g. on paper). The very creation of this draft becomes directly the tool that will be used, automatically, as the basis for its final implementation.

For example, it would be possible to draw an architecture/platform in the cloud, a database structure, a design of a neural network or a web page with all its components (in addition to the flow of interaction between the different views); and through this solution it will be possible to generate the necessary code (including the interactions between the different electronic devices involved) for its deployment.

Thus, among other functions, the solution allows for the creation of the user interface in a simple and automatic way, for example a graphical interface (better known as frontend) and the secondary interface (better known as backend) which is the function that collects and processes the data supplied through the user interface and, generally speaking, performs all the processes necessary for the correct functioning of the program (including, for example, the connections with databases or communications between the electronic devices involved, such as servers).

In the proposed embodiments, drawing the structure on paper and following some simple guidelines (using Artificial Intelligence and Machine Learning, for example Convolutional deep networks, mainly for the identification of the objects drawn on paper) enables the possibility of generating all the files and components necessary for the implementation of the computer program. Thus, by simply placing on paper the possible elements (for example, in the case of a web page these elements can be deployable, text boxes, titles . . . or the different components and relationships between them in the case of a cloud architecture or a neural network) it is possible to generate all the source code to generate a program (the web page, cloud architecture, neural network) and even its operating flow.

Therefore, this solution allows to bring the creation of complex technologies closer to any user, even if they do not have an advanced knowledge of it. As a consequence, it will be possible to plan and map complex architectures on paper that will be directly coded (on the platform you decide) so that they are directly available for implementation. On the other hand, the task of implementing the necessary solution to the architectural designer is streamlined, focusing only on its final deployment. All this process is possible due to the use of Artificial Intelligence and Artificial Vision when it comes to the recognition of the objects created in the original draft.

Therefore, the complexity to build from zero this type of architectures is drastically reduced, which leads to a wide range of application possibilities. For example, it can be used on any cloud platform so that its users, regardless of their technical level, could deploy their projects in a simple and intuitive way; or it can be integrated with a telecommunication operator's product to be used by the frontend design team for business purposes, since, by reducing this complexity, virtually any department of a company could design and implement its own IT solution.

One aspect of the invention refers to a method for the implementation of a computer project from n drawings, n>=1, hand-made by at least one user, wherein the method comprises the following steps performed by at least one electronic device:

a) receiving one or more images of the n drawings, wherein the drawings represent elements (components) of the computer project;

(b) detecting the elements represented in one or more images by applying one or more computer vision techniques;

c) if the elements involved in the computer project can be of several classes, classifying the detected elements using a machine learning model;

d) identifying the text contained in the detected elements by optical character recognition;

e) from the identified text, detecting whether in one or more images configuration and/or interaction properties of the detected elements are indicated and, if so, determining these properties from the identified text;

f) generating the one or more code files that make up the computer project based, at least, on the detected elements, the identified text and, if any, the configuration and/or interaction properties of the elements;

wherein the drawings are made following a predefined syntax that defines a series of rules for correspondence between drawings and elements of the computer project and/or rules for correspondence between characters or groups of characters of text included in the drawings and configuration or interaction properties of the elements of the computer project.

In an embodiment, step e) comprises, from the identified text, detecting whether one or more images indicate an operation flow (flow of interaction of elements) and if so, determining said flow from the identified text and step f) also includes creating dynamic paths between the elements for the execution of the determined flow.

The computer project can be, for example, a web application, a database, a cloud architecture, a neural network or many other types of computer project.

The machine learning model can be trained with a dataset following the predefined syntax. Also, the machine learning may comprise the use of deep convolutional neural networks and/or may use learning transfer technique(s).

In an embodiment, the step of detecting the elements that are in one or more images involves detecting the position and dimension of the elements.

The images of the drawings can be obtained by photographing or scanning the n drawings; and the images can be in any format type of format, for example, JPG or PNG or any other. The step of receiving the images of one or more drawings, includes: loading the images on an electronic device and (if this electronic device is not at least an electronic device where the method is carried out), receive through one or more communications networks the one or more images from the electronic device where they have been uploaded.

In an embodiment, the class of the elements is one of the following: Button, checkbox, radio button, image, paragraph, label, entry, or dropdown.

In one embodiment, the one or more files generated in step f) are sent to an electronic device of at least one user for download. The files generated in step f) (all or some of them) can be HTML files.

Another aspect of the invention relates to an electronic device that performs the steps of the methods described above. Thus, one aspect of the invention refers to an electronic device for the implementation of a computer project from n drawings, n>=1, hand-made by at least one user, wherein the electronic device comprises:

means of reception configured to receive one or more images of the n drawings (for example, through one or more communication networks), wherein the drawings represent elements of the computer project;

one or more electronic processors configured to:

detect the elements represented in one or more images by applying one or more computer vision techniques;

if the elements involved in the computer project are of several classes, classify the detected elements using a machine learning model;

identify the text contained in the detected elements by optical character recognition;

based on the identified text, detect whether in one or more images configuration or interaction properties of the detected elements are indicated and, if so, determining these properties from the identified text;

generate one or more code files that make up the computer project based on, at least, the detected elements, the identified text and, if any, the configuration and/or interaction properties of the elements;

wherein the drawings are made following a predefined syntax, (known to at least one user and the electronic device), that defines rules of correspondence between drawings and elements of the computer project and/or rules of correspondence between characters or groups of characters of text included in the drawings and configuration or interaction properties of the elements of the computer project.

Another aspect of the invention relates to a system that performs the steps of the methods described above. Thus, one aspect of the invention refers to an electronic system for the implementation of a computer project from n drawings, n>=1, hand-made by at least one user, in which the system comprises:

means of reception configured to receive one or more images of the n drawings of at least one electronic device from at least one user (for example, through one or more communication networks), wherein the drawings represent elements of the computer project;

one or more electronic processors configured to:

detect the elements represented in one or more images by applying one or more computer vision techniques;

if the elements involved in the computer project are of several classes, classify the detected elements using a machine learning model;

identify the text contained in the detected elements by optical character recognition;

based on the identified text, detecting whether in one or more images configuration or interaction properties of the detected elements are indicated and, if so, determining these properties from the identified text;

generating one or more code files that make up the computer project based on, at least, the detected elements, the identified text and, if any, the configuration and/or interaction properties of the elements;

wherein the drawings are made following a predefined syntax that defines rules for correspondence between drawings and elements of the computer project and/or rules for correspondence between characters or groups of characters of text included in the drawings and configuration or interaction properties of the elements of the computer project;

transmission means configured to deliver the one or more files generated at least one electronic device of at least one user for download.

One last aspect of the invention relates to a computer program product comprising a computer program code adapted to perform the methods described above, when such program code is executed on a computer device or programmable electronic device which may be: computer, a digital signal processor (DSP: "Digital Signal Processor", a field programmable gate array (FPGA), an application-specific integrated circuit, a microprocessor, a microcontroller or any other form of programmable hardware. A non-transient digital data storage medium is also provided to store a computer program comprising instructions that make a computer device running the program to perform the methods described above.

BRIEF DESCRIPTION OF THE FIGURES

Below, there is described very briefly a series of drawings that provide a better understanding of the invention and that are merely related to an embodiment of the invention which is presented as a non-limiting example of this.

PREFERRED EMBODIMENT OF THE INVENTION

Description of a method, electronic device and system for the automatic implementation of a computer project based on a design described in a draft (handmade). Said computer project can be, for example, the complete creation of a frontend/backend solution, including its operational flow (e.g., of a web application with its database), implementation of architectures/platforms in the cloud implementation of a database and even implementation of Machine Learning architectures for the deployment of neural networks.

Below is a detailed explanation of the operation of the proposed solution according to an embodiment of the invention. For clarification purposes, a specific example will be used as a thread, which in this case will consist of the implementation of a frontend and a backend to create a web page/application. Therefore, during the explanation, this web page model will be used as an example to explain its implementation and operation. Despite being a concrete example, this implementation covers and analyzes plenty of the processes that this solution offers, from the recognition of the objects in the draft, through the execution flow and ending with the implementation of a backend, in this case a database. As stated above, this solution is not only applicable for obtaining web pages but also for many other types of projects such as cloud architectures/platforms, database generation or implementation of neural networks (among other possible applications).

It is worth noting that, although this particular example shows the creation of a web page, practically any computer project that can be captured in a paper draft is potentially valid to be processed using the proposed solution. As this solution uses Artificial Intelligence for object recognition, only a specific training would be necessary to generate a model for each type of particular project. Thus, as stated above, this solution is not only applicable for obtaining web pages but for many other types of projects such as, among others, a cloud implementation or even, the creation of a neural network based in both cases from a paper draft.

Figure 1:
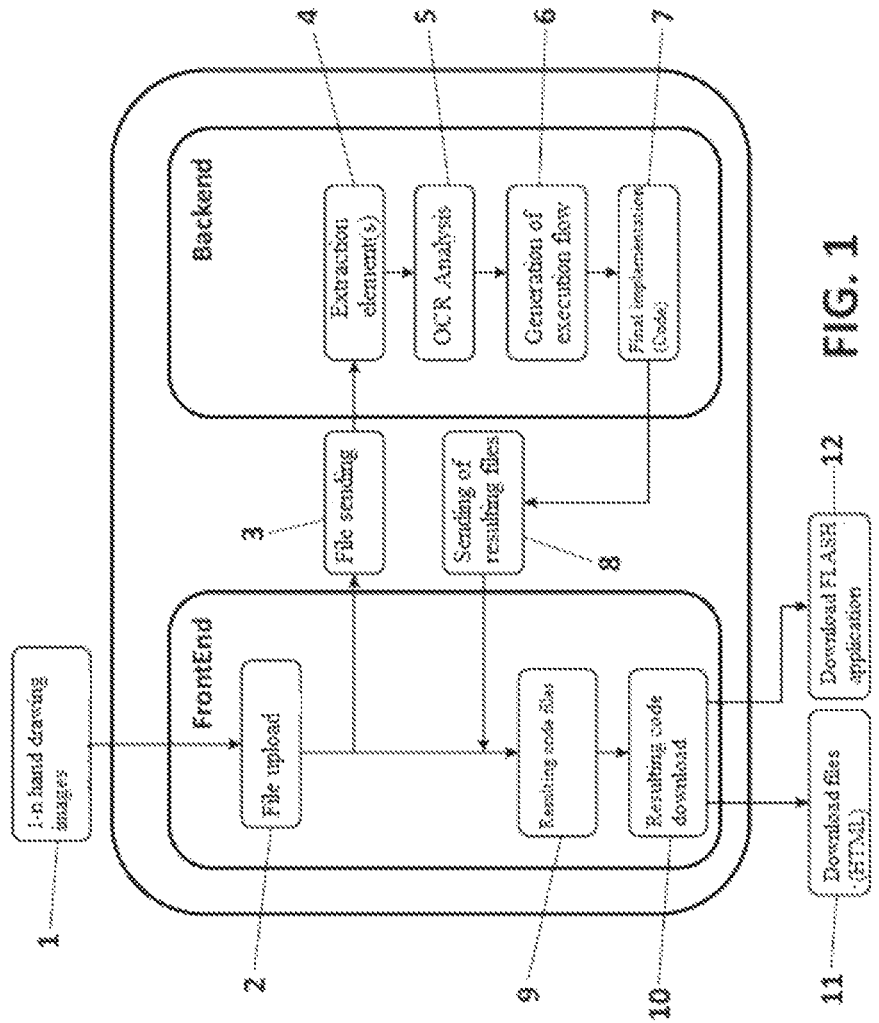
FIG. 1.—It shows a schematic diagram of the implementation of a web application (frontend/backend), according to a possible embodiment of the invention.

In FIG. 1, a diagram with the main operating blocks in an embodiment of the proposed invention is shown, for a specific example that, as mentioned above, consists of the implementation of a web page as a basis. In the example shown in FIG. 1, the input to be processed is a set of drawings representing web frontends, in which the functional element (also known as engine) proposed will receive, understand and structure the resulting html files, connecting those in which a workflow has been detected. Finally, this solution will be able to create with them a fully functional web application (using for example a Flask-type tool)). Both the set of html files and the complete application can be downloaded by the end user.

This invention can be implemented in a single electronic device or in several electronic devices (so that each of them performs one or more of the functions that make up this invention). In the latter case, the electronic devices involved will be conveniently communicated by one or more communication networks.

Using the diagram in FIG. 1 as a guide, each of the blocks and the function/functions performed will be described below:

Drawings (drafts) of the views: The process of generating the software project starts with the user's freehand drawings (1) on a paper. These drawings need to capture (in the case of the web application example) concretely the desired view (or more generally speaking, the design), using a certain syntax (predefined) for each of the elements that compose them, to allow that later (for example, through Artificial Intelligence) these be identified and classified. For example, the elements/components for the case of web pages can be of the following types or classes, among others: buttons, check boxes (most commonly known as "checkboxes" or "check button"), option buttons (most commonly known as "radio-buttons"), images, paragraphs, tags (h1, h2, h3), elements of type of input, drop-downs . . . . This is just an example for the case of implementation of web pages or applications, in the case of other implementation (cloud platforms, neural networks, databases . . . ) elements can be of many other types/classes. The syntax allows that in future steps the elements can be located and classified and thus, be able to assemble the final code that represents them.

Once the drawings have been made (in general terms, they will be referred as n drawings, n>=1), the electronic files with the images of these drawings will be obtained, which will be received by the implementation tool (also called engine). To obtain these images you can use any known mechanism that allows to obtain images in electronic format from drawings; thus, for example, you can photograph the drawings or you can scan them.

Extraction and classification of elements (4): In this step the transformation begins between the drawing and the future project (in this example a web application). To this end, the files with the images (photograph/scan) of the drawings are provided to the engine of the proposed solution by uploading the files with the images (2). For this purpose, you can use any known file/file format such as JPG or PNG or any other. After loading the files, they are sent (3) to the functional element (engine) that will be performed by the necessary backend. This file submission can be done using any known tool (such as POST). If the electronic device where the backend is implemented (for example a server) is different from the electronic device where the files are uploaded, this sending will involve communication between them through one or more communication networks (which can be of any type, wired, wireless, Wi-Fi, 2G, 3G, 4G among others.).

Upon receipt, the engine will start performing a detection task (extraction) of all the elements that are in the image (or images), through Artificial Intelligence techniques and specifically, for example, Artificial Vision. Due to this process, it will be possible to store both the position of each element (absolute and/or relative to other elements) in the drawing and its dimensions, which will be necessary for the subsequent location within the final generated code.

Then, the detected elements must be classified to know what type (also called class) they belong to, among all those that are supported; for example, those that have been mentioned above: buttons, check boxes etc. In some cases, this classification stage may not be necessary if there is only one possible type of elements to be detected, such as in the case of database implementation, as will be later explained.

Each class (element type) has its own characteristics and, for example, its own HTML (Hypertext Markup Language) code, so it is important to distinguish them as accurately as possible. As it is a problem of classification with images, a machine learning model is used, trained with its own data set, which follows the syntax that has been defined on a prior step. In one embodiment, the machine learning model used can be of the type of deep Convolutional Neural Network (CNN).

This syntax can be defined in any way, as long as the correspondence between drawings and the various elements is clear. Preferably it should be simple and should be known by the user to know how to draw each element, that is, the type of drawing that corresponds to each element. Thus, for example, a button can be drawn as a rectangle or square with a text (or even a mere random layout) inside, or an image can be indicated as a crossed-out rectangle or square (with an X inside). This is just an example and any other syntax for drawing the various elements can be used.

The model to classify the elements detected in the images (hand-made draft) preferably requires a reduced training time and acquires high accuracy with few epochs. To achieve this, a technique such as the Transfer Learning can be used in an embodiment. This Machine Learning technique consists of using a model that has already been trained and adjusted with a much larger set of images, in a more complex classification problem, and adapt it to the specific problem (in this case the detection of elements), training for that purpose only the last layers of the neural network. This is just one example and other types of machine learning techniques can be used in other embodiments.

Figure 2:
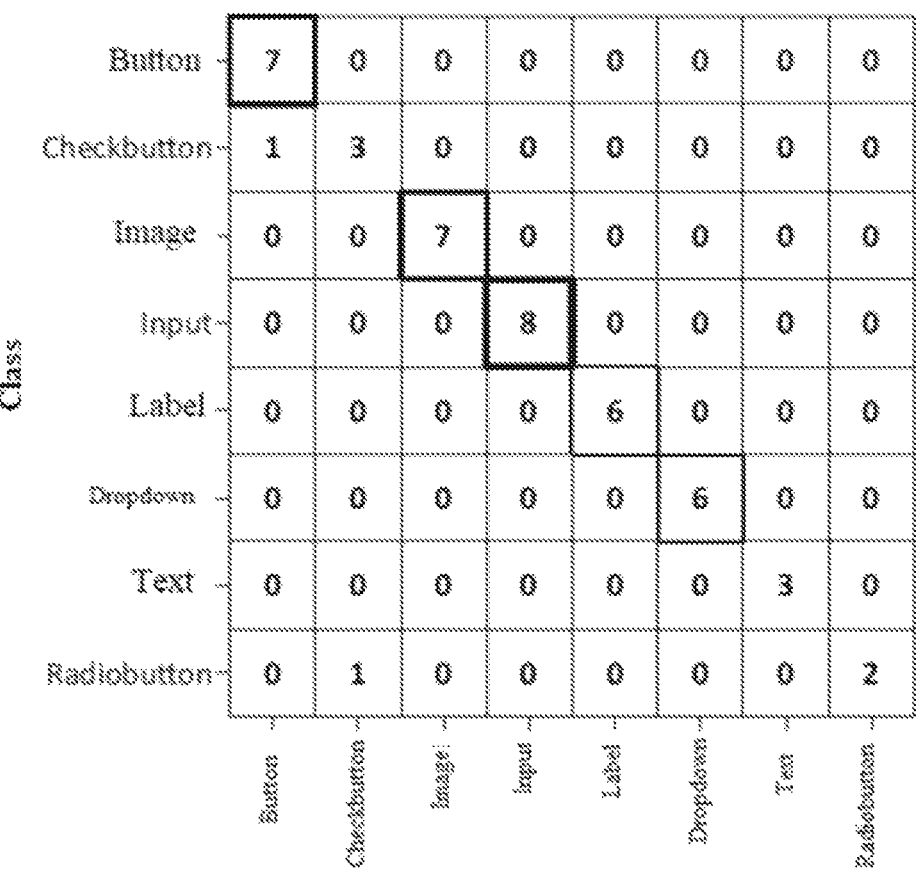
FIG. 2.—It shows a matrix of confusion of a concrete example of machine learning, according to a possible embodiment of the invention.

In a specific example in which the classification has been made using the Transfer Learning technique and a convolutional neural network Machine Learning model, the overall accuracy of the model in the validation set is 92.75% and requires 2.5 MB. Specifically, in this particular example, for Button, Image, Input, Label, Dropdown, and Text class elements a 100% precision has been achieved, for "Check button" class elements a 75% precision, and for "Radiobutton" class elements a 67% precision. The confusion matrix for this particular example is shown in FIG. 2.

After the classification, all the detected elements are available, together with their relative positions and dimensions, in addition to the classification of each of them. The next step will be to extract, from those elements in which it is necessary, the contained text to generate the correct code, as well as to create the operation flow (if the text affects that flow). This text detection is preferably performed by optical character recognition (OCR) as explained below.

Optical Character Recognition (5): Character recognition is carried out on elements that may potentially contain some text. In the example of the implementation of a web page, these elements can be, among others: buttons, labels, dropdown, "checkboxes" and "radio buttons". The objective of this process is to customize the elements with the data (text) that the user has included in his drawing, thus achieving a more accurate result (closer to the expected).

Recognition consists of two parts: On the one hand, the identification of the text sets within the element and, on the other hand, the transcription of the text they contain. The first part is used for elements that require a specific layout, for example, check boxes and radio buttons (radio buttons) in the case of web applications. Due to this process, it will be possible to know, for example, the number of alternatives that each of them contemplates, as well as their order. The second part of the recognition is fundamental for all of them, since it allows obtaining the texts that will be included in the elements generated in a subsequent stage.

This procedure is also basic to be able to recognize the flow of the future computer project generated, since it will allow for example to extract from the top label of the drawings the name of the view and the buttons as well as links created between elements or pages or other functions or interactions between elements. For this purpose, for each type of interaction or function, a default character (or group of characters) is defined in the syntax (so in an example of syntax the links between elements or pages are indicated with the character '#' at the beginning of the text). This default character (or group of characters) will have to be searched for in each text. The last step will be to place all the elements in their respective place in the generated code (HTML code in the example), as well as create the necessary paths and interactions in the implemented project.

Project Execution Flow Generation (6): As stated, it can be any type of computer project; in the case of the example, this project (software) would be a web application. Most computer projects (and especially web pages) consist of multiple views and generally have a flow (called an execution flow, an operational flow, or an interaction flow between elements), integrated with buttons or with different elements that allow to divide and organize the information there contained in a better way. Therefore, the development of a tool for the generation of web projects quickly and easily must contemplate this scenario. That is why the proposed solution gives the user the possibility of generating the aforementioned execution flow using the drawings themselves (drafts).

The flow, therefore, must first be detected and understood from the user's drawings. With this objective, the solution proposes a predefined syntax (in the form of policies or rules) that the user must follow to allow the electronic device that implements this invention to detect the endpoints between the views, as well as the names of each of them or, more generally speaking, where the link points or interactions between the different components of the project can be found. In an embodiment, the views to be integrated into a flow must be labeled with a name or title (integrated into an element of type 'label'), for example, at the top of the drawing. As already mentioned, to connect between views, you have to use elements (for example, buttons) in which text appears a default character or group of characters (for example, the character '#')', followed by the name of the view to be linked.

Upon understanding the flow required by the user, the solution will use an appropriate tool (in the case of the example you can use the Flask application for web application development or any other known tool that does this function) to create appropriate dynamic routes. For each view or linked element, a new path with the same name will be generated, with the aim of returning its code (in the example HTML code). The elements (e.g. buttons) will be linked using these paths, thus creating a fully functional application. All this allows to fulfill the suggested objective of generating an application with flow between views (or more generally speaking, flow of interaction between elements) using only the drawings of the user.

Final deployment (resulting code): Once the elements that make up the design drawn by the user have been obtained and identified, and the text there contained, the structure of the desired computer project is generated (7) (in the case of the example, the backend part will generate the structure of the new web application). To this end you can use any suitable known tool (in the case of the example you can use the Flask application or any other known tool that does this function). This will generate the corresponding code files (in the case of a web application, these files can have the extension .html and can be saved in the templates folder of the new generated application). That is, the files whose execution allows the implementation of the computer project are generated or, in other words, these files contain the necessary code for the implementation of the computer project.

If a workflow has been detected in the processing of the images, the relevant paths to that flow will be created (in the case of a web application, these paths are added to the app.py file of the new generated application). In this way a fully functional application is obtained (a Flask application in the case that this tool is used) with different routes and frontends customized. In the case of creating a web page using the Flask tool, there will be a generation step and an activation step and the files app.py, flaskapp.zip, htmls.zip will be obtained. Together with this structure a document readme.txt can be generated with the instructions related to the deployment of this application and a file requirements.txt that includes the dependencies of the project.

Once the code files of the computer project (software) created have been generated, they are sent (8) to the user (or rather, to the electronic device of the user who is using the solution for the project implementation, which will normally be the same user who has loaded the drafts). Any known tool (such as POST, using its function "Redirect", redirection) can be used to send the files. As noted above, if the electronic device where the backend is implemented (for example, a server) is different from the electronic device where the files are uploaded, this sending will involve communication between them through a communication network (which can be of any type, wired, wireless, Wi-Fi, 2G, 3G, 4G among other types.).

Upon receiving the files with the resulting code (9), they can be downloaded (10) by the user. In one embodiment, in the case of the creation of a web page, this download will involve the download of HTML files (11) and in the case of using the Flask tool it will also involve the download of the Flask application created (12).

Once the proposed solution has been explained, different examples of possible applications or embodiments (or more generally speaking, use cases) of the proposed invention are shown below. All applications/embodiments have the same objective: translate between hand drawings made by the user and a sequence of commands (script) that allow to create different software components. Or, in other words, a translation between a user's hand-drawn draft and the corresponding program's code or script. For this purpose, as we mentioned above, Artificial Intelligence will be used both in detection (for example, with computer vision techniques), and in the classification of elements (for example, through deep convolutional networks). Therefore, any component that is generated from regulated code is potentially a use case for the proposed solution. To illustrate its usefulness, four cases of use of the proposed solution are now presented, which give rise to four different tools, but all using the same procedure proposed in this invention (these use cases are shown only as a non-limiting example, as the proposed solution may have many other applications).

Website: This first use case is a tool that provides the user with the ability to convert n drawings (n>=1) into a web application with a given workflow. To do this, the user will make one or more drawings with the characteristic elements of a web page that are supported by the project and that match a predetermined syntax (preferably attached in the documentation of the tool). Such drawings may or may not be designed with the implementation of a workflow. Once the relevant drawings have been made, we will proceed to their photograph (or scan) to go on with the upload of the files with these images, as explained above.

Figure 3A:
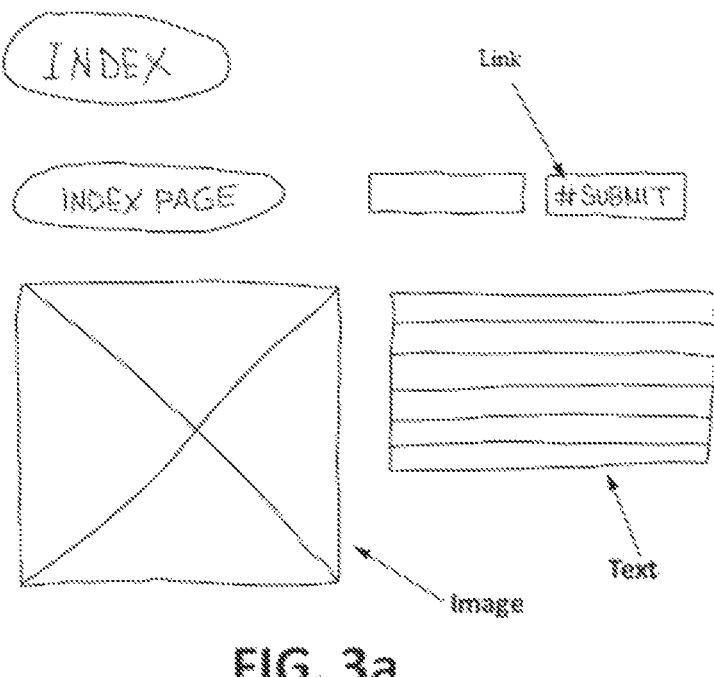
FIGS. 3*a* and 3*b*.—They show an example of input drawings for the implementation of a computer project (in this case a web page), according to an embodiment of the invention.
Figure 3B:
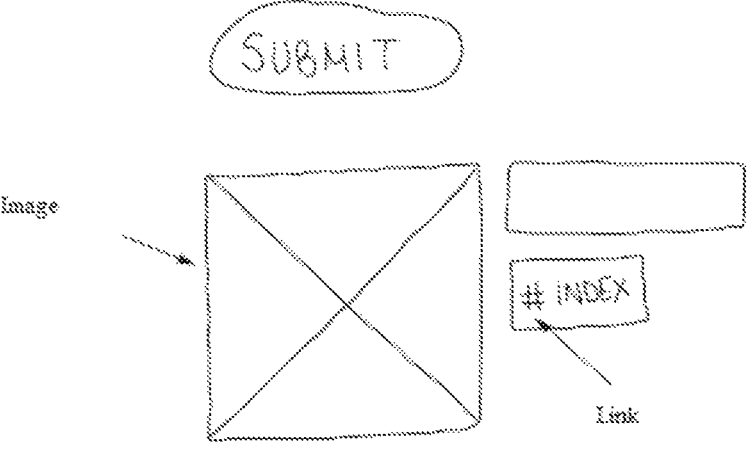

FIGS. 3*a* and 3*b* show a non-limiting example of input drawings to this tool for a specific case. FIG. 3*a* shows the index page that includes a title, an image, a possible text, and a link (indicated by the #character) to the submission page (better known as "Submit"). The submission page is shown in FIG. 3*b* with an image, buttons and a link to the index page.

This tool can be implemented in the form of a web application that allows the user to translate a drawing on a web page (such application in an example can be called "Draw your Web"). The tool can have a main front where the function of uploading files is located; this will allow the user to select and send the photographs of the drawings made previously to the backend part.

As explained above, the procedure executed by the tool to understand the input image (or images) is initiated by using techniques of Computer Vision, with the aim of extracting all the elements that compose it. The next step will be to know the class (type) of each of them. For this purpose, the tool has its own training set, which includes hand drawings of all components, with which a deep Convolutional Network has been trained that allows the classification work. Upon extraction and classification of components, the last step is to use OCR techniques to understand the texts so that you can apply them to the final result.

Once the identification and classification process is finished, the generation of the results will begin (the web application and the generated files, for example, in the form of a .zip file with the generated HTML codes) and the deployment of the resulting application.

In order to show the results obtained, you can launch the resulting application in a new process with a specific port and path. If the process has been correctly carried out, a redirect will be executed in the "parent" application to the path where the results will be displayed. The main view of this "sub" application can be displayed from this path where it will be embedded, for example, in an iframe element (which is an HTML element that allows you to insert or embed an HTML document within a main HTML document). In this route, in addition to being able to visualize the corresponding results, several buttons can be presented with the function and the objective of downloading the generated results.

Databases (backend): This second use case is a tool that provides the user with the ability to generate a database and its script (following the syntax of My SQL or any other) from one or more drawings. To do this, the user will draw one or more tables (and their relationships) according to a default syntax (preferably attached in the tool documentation). Each of the tables will be composed of common elements within the design of a database, such as data, its type, key type, and references. Once the drawing has been made, we will proceed to their photograph/scan and then proceed to the upload of the file with that photograph(s) to begin the analysis.

This tool can be implemented in the form of a web application that allows the user to translate a drawing in a database (such application in an example can be called "Draw your database" or "Draw your DB"). The tool can have a main frontend where the function of uploading files is located; this will allow the user to select and send the photographs of the drawing or drawings made.

Figure 4:
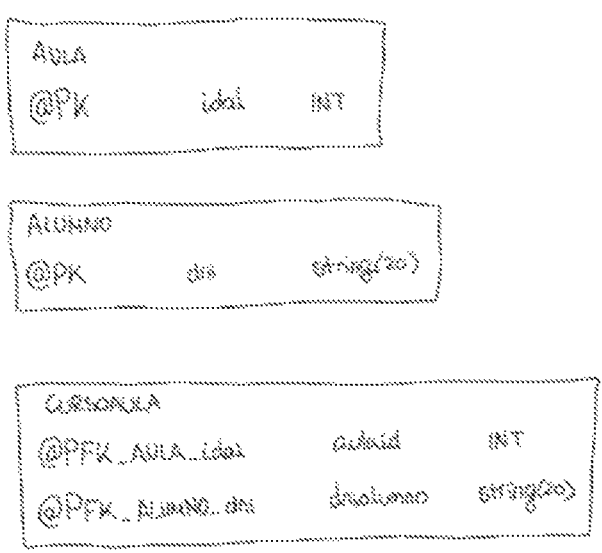
FIG. 4.—It shows an example of an input drawing for the implementation of a computer project (in this case a database), according to an embodiment of the invention.

FIG. 4 shows a non-limiting example of an input drawing to this tool for a specific case. As shown in the figure, the database fields in this example will be AULA (classroom in English), ALUMNO (Student in English), and CURSO-AULA.

Once the image is uploaded, Computer Vision techniques will be used to extract the elements (in this case the tables) from the input drawings. As there are no multiple elements of different kinds to be detected, this tool does not necessarily require a classification phase since all the extracted elements are considered to be tables (that is, they belong to the same class). On the other hand, the text detection phase becomes more relevant when using OCR, since it will be the crucial part in which all the relevant data will be extracted from the tables: for example, names, attributes and keys, both primary and foreign, that will allow to establish relationships between the different tables. Once this process is done, the resulting script will be generated (in a .sql file if the MySQL tool has been used) from the extracted data. In addition to a file (for example in a .db file) in which the database will be obtained.

The following, as an example for a specific non-limiting case, code resulting from applying the tool to the input drawing shown in FIG. 4 is shown:

```
CREATE TABLE CURSOAULA (
    aulaid INT,
    dnialumno string(20),
    PRIMARY KEY(aulaid, dnialumno),
    FOREING KEY (aulaid)
        REFERENCES CLASSROOM(idal),
    FOREING KEY (dnialumno)
        REFERENCES STUDENT(dni)
);
CREATE TABLE ALUMNO (
    dni string(20),
    PRIMARY KEY(dni)
);
CREATE TABLE AULA (
    Int IDAL,
    PRIMARY KEY(IDAL)
);
SELECT * from CURSOAULA;
SELECT * from ALUMNO;
SELECT * from AULA;
```

Cloud Platform/Architecture: This third use case is a tool that provides the user with the ability to generate Cloud architectures, from one or more drawings. This tool can be implemented in the form of a web application that allows the user to translate a drawing in an architecture or network infrastructure in the cloud (such application in an example can be called "Draw your Cloud"). The application can have a main frontend where the function of uploading files is located; this will allow the user to select and send the images (photographs or scan) of the drawing or drawings made for the generation of the infrastructure in the cloud.

Unlike the two previous use cases, this generation will not be direct, and it will be necessary to use a software tool that allows the creation of more or less complex software infra-structures of this type. In one embodiment, "Terraform" will be used, which is a tool that defines a high-level language that allows to create infrastructure as code and use it to deploy architectures in most of the Cloud providers in the market. Therefore, the result of this use case will be the generation of Terraform code (it) from a drawing so that, later, the user can collect this exit code and use it in the aforementioned Terraform tool for creating infrastructure in the cloud (the use of Terraform is only an example and any other software tool with appropriate functionality can be used.)

Cloud architectures are composed of different compo-nents structured in the form of a tree, with a series of configurable parameters for each of them. The user will draw the configuration of the Cloud architecture following a simple syntax previously defined (preferably attached in the documentation of the tool). This syntax seeks to establish a midpoint between flexibility in design and the simple and rapid generation of architecture; for each element, the user can be allowed to enter certain settings preceded by a certain character or groups of characters (in one embodiment that character is '#'), all explained in the project documentation.

Figure 5:
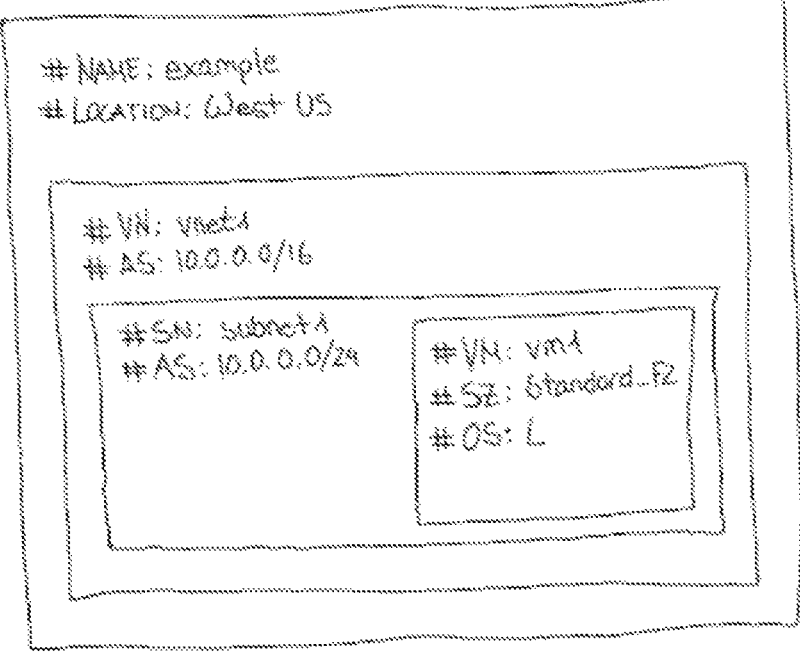
FIG. 5.—It shows an example of an input drawing for the implementation of a computer project (in this case a cloud architecture), according to an embodiment of the invention.

FIG. 5 shows a non-limiting example of an input drawing to this tool for a specific case. In the figure you can see the level of abstraction achieved by the tool, which is founded (but is much higher) on which already offers the software infrastructure creation tool, in this example Terraform.

Once the drawing has been made (one or more), we will proceed to their photograph/scan and then proceed to the upload of files with that photograph(s) or scans, to begin the analysis. Then, by using computer vision techniques, this solution is able to extract the different elements, as well as their hierarchies, classify them and with OCR techniques to understand the configurations drawn by the user, following the predefined syntax.

The following, as an example for a specific non-limiting case, code resulting from applying the tool to the input drawing shown in FIG. 5 is shown:

```
provider "azurem" {
    version = "=2.20.0"
    features { }
    subscription_id = "..."
    client_id = "..."
    client_secret = "..."
    tenant_id = "..."
}
resource "azurem_resouce_group" "example" {
    name = "example-resources"
    location = "WestUS"
}
resource "azurem_virtual_network" "vnetd" {
    name = "vnetd-network"
    address_space = ["10.0.0.0/16"]
    location = azurem_resouce_group.example.location
    resource_group_name = azurem_resource_group.example.name
}
resource "azurem_subnet" "subnet/" {
    name = "subnet/-subnet"
    resource_group_name = azurem_resource_group.example.name
    virtual_network_location = azurem_virtual_network.vnetd.location
    address_prefixes = ["10.0.0.0/24"]
}
resource "azurem_network_interface" "vml-interface-subnet/" {
    name = "vml-interface-subnet/-name"
    location = azurem_resouce_group.example.location
    resource_group_name = azurem_resource_group.example.name
    ip_configuration {
        name = "subnet/"
        subnet_id = azurem_subnet.subnet/.id.
```

-continued

```
      private_ip_address_allocation = "dynamic"
    }
}
```

5

Neural networks: This fourth use case is a tool that provides the user with the ability to generate neural networks (for example, deep neural networks) from one or more drawings. This tool can be implemented in the form of a web application that allows the user to translate a drawing in a neural network (such application in an example can be called "Draw your neural network"). The application can have a main frontend where the function of uploading files is located; this will allow the user to select and send the images of the drawing or drawings made for the generation of the neural network.

For the generation of the neural network it will be necessary to use a software tool that allows the creation of neural networks. In one embodiment, "Keras" will be used (deep learning development library written in Python, which allows to define models in a very simple way and, above all, the possibility of exporting and/or importing models from a json format). This last functionality will make it possible that the tool can generate from the drawing a model in Python and with it, using the native export of the library, transform it to json format. The output of the tool will be double: on the one hand, the model (written in Python using Keras) and, on the other hand, a file (in JSON format) in which the model is fully defined and can be exported to other tools (the use of Keras is only an example and any other software tool with appropriate functionality can be used).

A visual syntax is pre-defined to make drawings even more intuitive. In one example, in that syntax, input layers are illustrated as circles; intermediate layers as squares; and output layers as trapezes. The connection of these elements by means of arrows allows to define a complete and visually clear neural network (this is only an example, and any other definition can be used for the syntax).

As there are elements of different kinds in the drawings, several processes have been required: to begin with as in the rest of the use cases, computer vision techniques to detect and extract each of the elements; then, to carry out the work of their classification, a set of own training data has been created that includes all the forms (classes) of supported elements drawn by hand, which allows to train a Machine Learning model (in a Deep Convolutional Network embodiment) for this work. Finally, with all the elements extracted and classified, OCR techniques allows to extract the text that defines all the configurations of the different layers.

Figure 6:
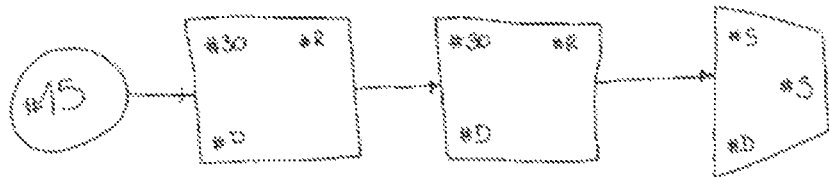
FIG. 6.—It shows an example of an input drawing for the implementation of a computer project (in this case a neural network), according to a deployment of the invention.

FIG. 6 shows a non-limiting example of an input drawing to this tool for a specific case. You can see four different layers (one input, two intermediate and one output) with their corresponding configurations that follow the syntax of the project. In one embodiment, from the entry shown in FIG. 6, the proposed tool will generate the codes shown below, which correspond to 1) the definition in JSON format of the model's dense layer" and 2) definition of the model obtained in python language:

```
      1)
      "class_name": "Sequential",
      "config": {
        "name": "sequential"
        "layers": [
          {
```

-continued

```
          "class_name": "InputLayer",
          "config": {
            "batch_input_shape": [
              null,
              15
            ],
            "dtype": "float32",
            "sparse": false,
            "ragged": false,
            "name": input_1
          }
        },
        {
        "class_name": "Dense",
        "config": {
          "name": "dense",
          "trainable": true,
          "dtype": "float32",
          "units":30,
          "activation": "relu",
          "use_bias": true,
          "kernel_initializer": {
            "class_name": "GlorotUniform",
            "config": {
              "seed":null
            }
          },
      2)
      model = Sequential( )
      model.add(layers.Input(shape=15))
      model.add(layers.dense(30, activation='relu'))
      model.add(layers.dense(30, activation='relu'))
      model.add(layers.dense(5, activation='softmax'))
      model_json = model.to_json( )
```

In short, the proposed invention allows the implementation of an architecture of a software project from a simple draft (hand-made) of its design. This applies to many different architectures and, in general, if it is possible to design this architecture on paper, it is potentially possible to convert it into a implementation by applying this solution. Thus, it is not only limited to the creation of frontend/backend for web pages but also applies, for example, to the generation of databases, the design and deployment of Cloud architectures (as explained, it is possible to create the architecture of a Cloud design by hand on a paper and then generate all the necessary files for its implementation; that is, following a defined pattern, the hand-drawing of an architecture makes it possible to generate its implementation in any cloud) or the design and implementation of neural networks (from a draft, where the layers, type of activation, initial nodes, etc. are indicated, it is possible to create the source code necessary for its implementation).

As indicated depending on the type of computer project, for some of the processes, such as for the generation of the files with the project code or for the execution of these files, some appropriate software tool can be used in each case. Thus, if the project is a web application, the Flask application can be used for the generation of the code files; if the project is a database for the generation of the files, the MySQL tool can be used; if the project is a cloud architecture you can use the Terraform tool to generate the cloud architecture (from the generated files). Lastly, if the project is a neural network for the generation of the files with the necessary code the Keras tool can be used.

As has been observed in the proposed solutions, using a diagram made on paper as a basis (following some basic rules), this implementation is able to generate everything necessary to implement a computer project. This greatly facilitates the implementation both to generate a proof of concept and even to generate a solid foundation for its creation. Moreover, it allows users without advanced knowledge to be able to generate this type of projects in a simple, fast and visual way.

In this text, the term "comprises" and its derivations (such as "comprising", etc.) should not be understood in an exclusive sense, i.e., these terms should not be construed as excluding the possibility that what is described and defined may include more elements, stages, etc.

After having sufficiently described the nature of the invention, as well as how to put it into practice, it should be noted that its different parts may be manufactured in a variety of materials, sizes and shapes, and may also be introduced in its constitution or procedure, those variations advised by practice, as long as they do not alter the fundamental principle of this invention.

This detailed description is provided to help a complete understanding of the invention. Therefore, experts in the field will recognize that variations, changes or modifications of the achievements described here can be carried out within the scope of protection of the invention. Also, the description of well-known functions and elements is omitted for clarity and conciseness purposes. The description and drawings simply illustrate the principles of the invention. It should therefore be noted that experts in the technique may devise several provisions which, although not explicitly described or shown in this document, represent the principles of the invention and are within its scope. In addition, all examples described in this document are provided primarily for pedagogical purposes to help the reader understand the principles of the invention and the concepts contributed by the inventor(s) to improve the technique, and they should be considered as non-limiting with respect to such examples and conditions specifically described. In addition, everything in this document related to the principles, aspects and embodiments of the invention, as well as the specific examples thereof include equivalences thereof.

Although this invention has been described with reference to specific embodiments, experts in the technique must understand that the previous and various other changes, omissions and additions in the form and detail thereof may be made without deviating from the scope of the invention as defined by the following claims.

The invention claimed is:

1. A method for the implementation of a computer project from n drawings, n>=1, hand-made by at least one user, wherein the method comprises the following steps performed by at least one electronic device:

receiving one or more images of the n drawings, wherein the drawings represent elements of the computer project;

detecting the elements represented in one or more images by applying one or more computer vision techniques;

if the elements involved in the computer project can be of several classes, classifying the detected elements using a machine learning model;

identifying text contained in the detected elements through optical character recognition;

based on the identified text, detecting whether in one or more images one or both of configuration and interaction properties of the detected elements are indicated and, if so, determining these properties from the identified text;

generating a document containing instructions related to a deployment of the computer project and one or more code files that make up the computer project based on, at least, the detected elements, the identified text, and the configuration and interaction properties of the elements, if any, where said one or more code files contain necessary code for implementation of the computer project when the one or more code files are executed;

wherein the drawings are made following a predefined syntax defining a series of one or both of rules for correspondence between drawings and elements of the computer project and rules for correspondence between characters or groups of characters of text included in the drawings and configuration and interaction properties of the elements of the computer project, wherein in the predefined syntax is defined, for each type of interaction between the elements, a default character or group of characters; and wherein the computer project is a cloud architecture or a neural network.

2. A method according to claim 1, further comprising:

from the identified text, detecting whether in the one or more images an operation flow is indicated; and determining said operation flow from the identified text.

3. A method according to claim 1, wherein the machine learning model is trained with a data set following the predefined syntax.

4. A method according to claim 1, wherein detecting the elements represented in the one or more images comprises detecting the position and dimension of the elements.

5. A method according to claim 1, wherein receiving the images of one or more drawings, comprises: loading the images into an electronic device and receiving through a communications network the one or more images from the electronic device where they have been loaded.

6. A method according to claim 1, wherein machine learning comprises the use of deep convolutional neural networks.

7. A method according to claim 1, wherein the machine learning model uses a learning transfer technique.

8. A method according to claim 1, wherein the images are obtained by taking pictures of or scanning the n drawings.

9. A method according to claim 1, wherein the classes include one or more of the following: button, checkbox, radiobutton, image, paragraph, label, entry, or dropdown.

10. A method according to claim 1, wherein one or more generated code files are sent to an electronic device of at least one user for download.

11. A computer-readable non-transitory medium that stores a computer program comprising instructions for making a computer device running the program perform the method defined according to claim 1.

12. An electronic device for the implementation of a computer project from n drawings, n>=1, hand-made by at least one user, wherein the electronic device comprises:

an engine configured to receive one or more images of the n drawings, wherein the drawings represent elements of the computer project; and one or more electronic processors configured to:

detect the elements represented in one or more images by applying one or more computer vision techniques;

if the elements involved in the computer project are of several classes, classify the detected elements using a machine learning model;

identify text contained in the detected elements by optical character recognition;

based on the identified text, detect whether in one or more images one or both of configuration and interaction properties of the detected elements are indicated and, if so, determining these properties from the identified text; and generate a document containing instructions related to a deployment of the computer project and one or more code files that make up the computer project based on, at least, the detected elements, the identified text, and the configuration and interaction properties of the elements, if any, where said one or more code files contain necessary code for implementation of the computer project when the one or more code files are executed;

wherein the drawings are made following a predefined syntax, known to at least one user and the electronic device, that defines rules of correspondence between drawings and elements of the computer project and rules of correspondence between characters or groups of characters of text included in the drawings and configuration and interaction properties of the elements of the computer project, wherein in the predefined syntax is defined, for each type of interaction between the elements, a default character or group of characters, and wherein the computer project is a cloud architecture or a neural network.

13. An electronic system for the implementation of a computer project from n drawings, n>=1, hand-made by at least one user, wherein the system comprises a first electronic device according to claim 12 and a second electronic device of the at least one user, wherein the one or more images of the n drawings are received from the second electronic device and wherein the system also comprises:

a transmitter configured to send the one or more generated files to the second electronic device for download.

\* \* \* \* \*